(12) United States Patent
Kubo et al.

(10) Patent No.: US 6,492,879 B2
(45) Date of Patent: Dec. 10, 2002

(54) VOLTAGE-CONTROLLED OSCILLATOR

(75) Inventors: Kuichi Kubo, Saitama (JP); Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 09/877,045

(22) Filed: Jun. 11, 2001

(65) Prior Publication Data

US 2001/0052826 A1 Dec. 20, 2001

(30) Foreign Application Priority Data

Jun. 19, 2000 (JP) ......................... 2000-182793

(51) Int. Cl.[7] .................. H03B 5/30; H03B 5/36
(52) U.S. Cl. .................. 331/116 R; 331/108 R
(58) Field of Search .................. 331/116 R, 108 R, 331/109, 116 FE, 117 R, 117 FE, 117 D, 108 C

(56) References Cited

U.S. PATENT DOCUMENTS 4,550,293 A * 10/1985 Driscoll .................. 331/116 R
5,747,857 A * 5/1998 Eda et al. .................. 257/416
6,172,576 B1 * 1/2001 Endo et al. .................. 331/116 R

FOREIGN PATENT DOCUMENTS

JP          7-273547          10/1995

* cited by examiner

*Primary Examiner*—Tuan T. Lam
(74) *Attorney, Agent, or Firm*—Oblon, Spivak, McClelland, Maier & Neustadt, P.C.

(57) ABSTRACT

A voltage-controlled oscillator (VCO) using a transistor, capable of-using a capacitor for DC blocking with small capacitance and achieving a large amount of change in the oscillating frequency. The voltage-controlled oscillator comprises a transistor for oscillation and amplification, first and second nodes, a quartz-crystal element inserted between the first and second nodes, a first capacitor connecting the first node with a base of the transistor, a second capacitor connecting the second node with a collector of the transistor, a first variable capacitance diode connected to the first node, a second variable capacitance diode connected to the second node, and means for applying a control voltage to the first and second variable capacitance diodes.

16 Claims, 2 Drawing Sheets

VOLTAGE-CONTROLLED OSCILLATOR

BACKGROUND OF THE INVENTION

1. Field of the Invention

The present invention relates to a voltage-controlled oscillator (VCO) using a piezoelectric vibrator, and more particularly to a voltage-controlled oscillator which uses a quartz-crystal element as a piezoelectric vibrator and a transistor as an element for oscillation and amplification, achieves a large amount of change in frequency, and allows a reduction in circuit size.

2. Description of the Prior Art

A voltage-controlled oscillator using a piezoelectric vibrator such as a quartz-crystal element and providing an oscillating frequency depending on an applied control voltage is incorporated in, for example, a PLL (Phase Locked Loop) circuit. In recent years, it is desired that the voltage-controlled oscillator is reduced in size by forming circuit elements except a quartz-crystal element as an IC (Integrated Circuit) and exhibits a large change in capacitance with respect to the applied control-voltage, that is, a large change in the oscillating frequency.

FIG. 1 shows an exemplary configuration of a conventional voltage-controlled oscillator. The voltage-controlled oscillator comprises bipolar transistor 1 for oscillation, quartz-crystal element 2 as a piezoelectric vibrator, and two variable capacitance diodes D1, D2. Transistor 1 has a grounded emitter and a collector connected to power supply $V_{cc}$ through load resistor 4. Quartz-crystal element 2 is connected between a base and the collector of transistor 1. A connecting point of quartz-crystal element 2 and transistor 1 is referred to as node A.

First variable capacitance diode D1 is inserted between node A and a ground point through first capacitor C1 for DC blocking. Second variable capacitance diode D2 is inserted between the collector of transistor 1 and a ground point through second capacitor C2 for DC blocking. The voltage-controlled oscillator is provided with control voltage $V_c$ from the outside to change the capacitance values of variable capacitance diodes D1, D2. Control voltage $V_c$ is applied to a connecting point (node B) of capacitor C1 and first variable capacitance diode D1 through resistor 3a for radio frequency blocking, and to a connecting point (node C) of capacitor C2 and second variable capacitance diode D2 through resistor 3b for radio frequency blocking. In addition, resistor 5 for self-bias is inserted between the collector and the base of transistor 1 to supply a base bias voltage from power supply $V_{cc}$ to transistor 1.

The portion of the voltage-controlled oscillator except quartz-crystal element 2 is formed as an integrated circuit and incorporated into an IC chip.

In the voltage-controlled oscillator, quartz-crystal element 2 and variable capacitance diodes D1, D2 constitute a resonant circuit or a resonant loop. Specifically, a resonant circuit including quartz-crystal element 2 as an inductance component and variable capacitance diodes D1, D2 as capacitance components is formed. The resonance frequency component of the resonant circuit is fed back to and amplified by transistor 1 to obtain oscillation output $V_{out}$ from the collector side.

While the oscillating frequency of the oscillator generally depends on the resonance frequency of the resonant circuit, the capacitance of transistor 1 or the like is added in. As a result, the oscillating frequency is determined by the series equivalent capacitance on the circuit side viewed from both ends of quartz-crystal element 2, that is, the load capacitance of quartz-crystal element 2. Since control voltage $V_c$ applied from the outside changes the capacitance values of variable capacitance diodes D1, D2, the load capacitance of quartz-crystal element 2 is also changed. Thus, the oscillating frequency can be changed by control voltage $V_c$.

FIG. 2 equivalently shows only capacitance components viewed from quartz-crystal element 2 extracted from the aforementioned voltage-controlled oscillator. In FIG. 2, $C_{Tr}$ represents the capacitance component of transistor 1, while $C_{D1}$ and $C_{D2}$ represent the capacitance components of first and second variable capacitance diodes D1, D2, respectively. Specifically, when viewed from quartz-crystal element 2, capacitance component $C_{Tr}$ of transistor 1 is connected in parallel with a circuit including capacitances $C_{D1}$, $C_{D2}$ of variable capacitance diodes D1, D2 and capacitors C1, C2 for DC blocking connected in series. In other words, capacitors C1, C2 are inserted in series into a resonant loop comprising quartz-crystal element 2 and variable capacitance diodes D1, D2. In such a circuit, since a change in capacitance of first and second variable capacitance diodes D1, D2 caused by control voltage $V_c$ is canceled with capacitors C1, C2 and reduced as a whole, it is difficult to achieve a large amount of change in the oscillating frequency.

A large amount of change in the oscillating frequency can be achieved by using capacitors C1, C2 for DC blocking with large capacitance values. In this case, however, an IC chip including the voltage-controlled oscillator inevitably has a larger size, thereby presenting a problem of impairing a reduction in size.

SUMMARY OF THE INVENTION

It is an object of the present invention to provide a voltage-controlled oscillator using a transistor as an element for oscillation and amplification, allowing a reduction in size when it is formed as an IC chip, and achieving a large amount of change in the oscillating frequency.

The present inventors focused attention on "Voltage-Controlled Inverter Oscillator Circuit" disclosed in Japanese Patent Laid-open Publication No. 7-273547 (JP, A, 07273547) by the assignee of the present application. The inverter oscillator circuit is a voltage-controlled type oscillator circuit using an inverter serving as a logical gate, and prevents a reduction in effectual capacitance change by connecting a DC blocking capacitor to a variable capacitance diode in parallel, rather than in series. The present inventors examined the application of the technique disclosed in the publication to a voltage-controlled oscillator including a transistor having an emitter grounded, and a base and a collector between which a quartz-crystal element is connected, and have completed the present invention.

The voltage-controlled oscillator of the present invention comprises a transistor for oscillation and amplification, first and second nodes, a piezoelectric vibrator such as a quartz-crystal element inserted between the first and second nodes, a first capacitor connecting the first node with a first terminal of the transistor, a second capacitor connecting the second node with a second terminal of the transistor, a first variable capacitance diode connected to the first node, a second variable capacitance diode connected to the second node, and means for applying a control voltage to the first and second variable capacitance diodes.

In the present invention, with the aforementioned configuration, the first and second capacitors for DC blocking are equivalently connected in parallel with the first and second variable capacitance diodes. Thus, an effectual capacitance change in the first and second variable capacitance diodes is not reduced. The configuration allows the use of the first and second capacitors with small capacitance values, a reduction in size of an IC chip when the voltage-controlled oscillator is formed as the IC chip, and a wide changing range of the oscillating frequency.

DESCRIPTION OF THE PREFERRED EMBODIMENT

Figure 1:
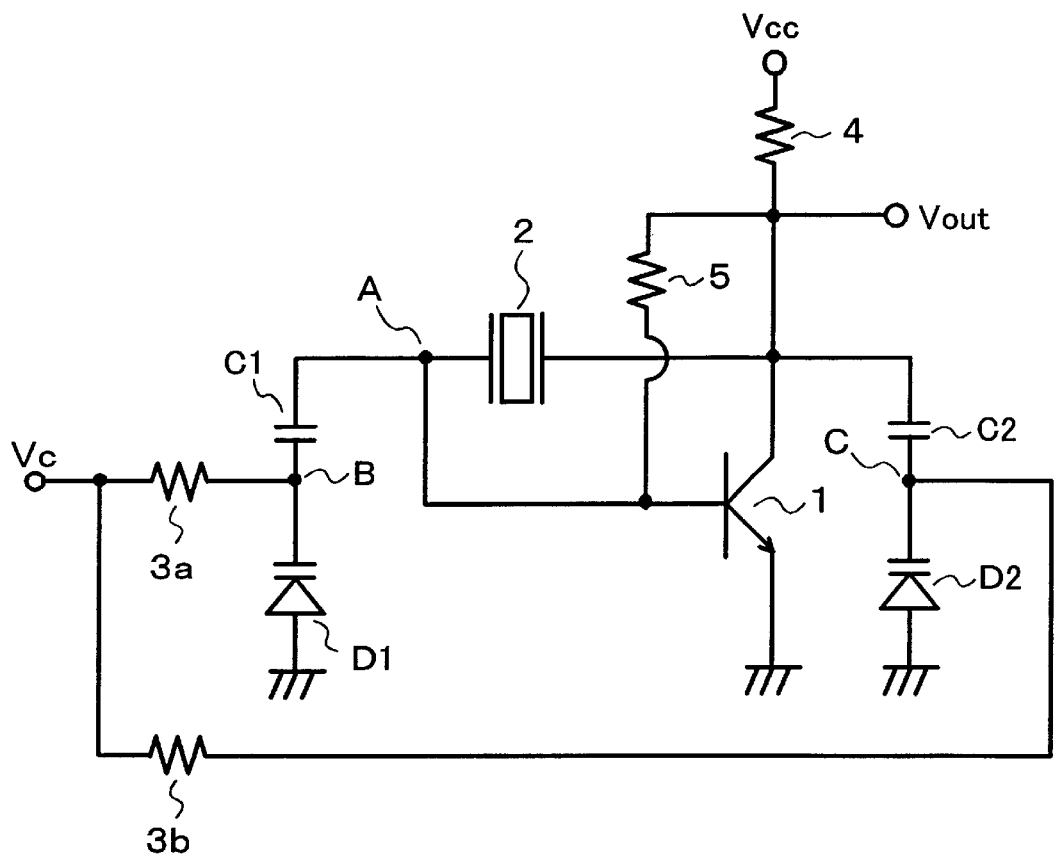
FIG. 1 is a circuit diagram showing an exemplary configuration of a conventional voltage-controlled oscillator.
Figure 2:
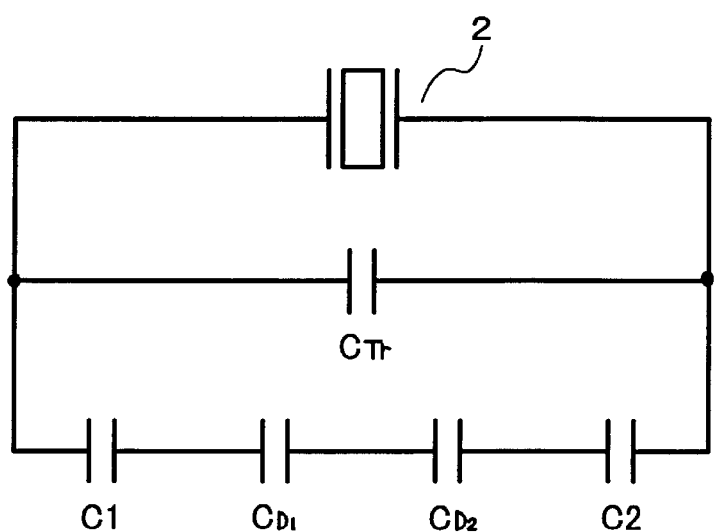
FIG. 2 is an equivalent circuit diagram illustrating extracted capacitance components of the voltage-controlled oscillator shown in FIG. 1.
Figure 3:
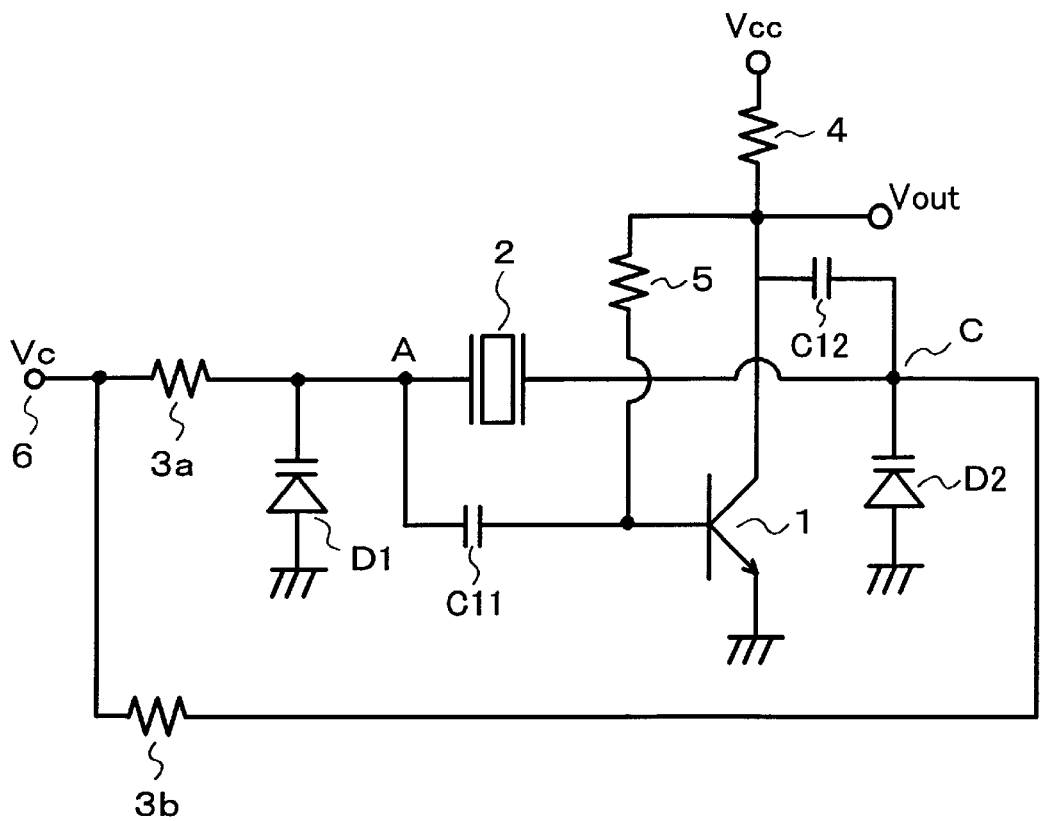
FIG. 3 is a circuit diagram showing a configuration of a voltage-controlled oscillator according to a preferred embodiment of the present invention.

In FIG. 3 showing a voltage-controlled oscillator according to a preferred embodiment of the present invention, components identical to those in FIG. 1 are designated with the same reference numerals, and redundant description is not repeated therefor.

The voltage-controlled oscillator shown in FIG. 3 comprises bipolar transistor 1 for oscillation and amplification having a collector connected to power supply $V_{cc}$ through resistor 4 and a grounded emitter, quartz-crystal element 2 inserted between a base and the collector of transistor 1, and two variable capacitance diodes D1, D2 for changing the oscillating frequency. The voltage-controlled oscillator also comprises capacitors C11, C12 for DC blocking instead of capacitors C1, C2 in the circuit shown in FIG. 1.

First capacitor C11 is inserted between a first terminal of quartz-crystal element 2 and the base of transistor 1. Second capacitor C12 is inserted between a second terminal of quartz-crystal element 2 and the collector of transistor 1. When a connecting point of quartz-crystal element 2 and capacitor C11 is referred to as node A, and a connecting point of quartz-crystal element 2 and capacitor C12 is referred to as node C, first variable capacitance diode D1 is provided between node A and a ground point and second variable capacitance diode D2 is provided between node C and a ground point.

Control voltage $V_c$ input from the outside through input terminal 6 is applied to nodes A, C through resistors 3a, 3b for radio frequency blocking, respectively. Thus, control voltage $V_c$ is applied to each variable capacitance diode.

Figure 4:
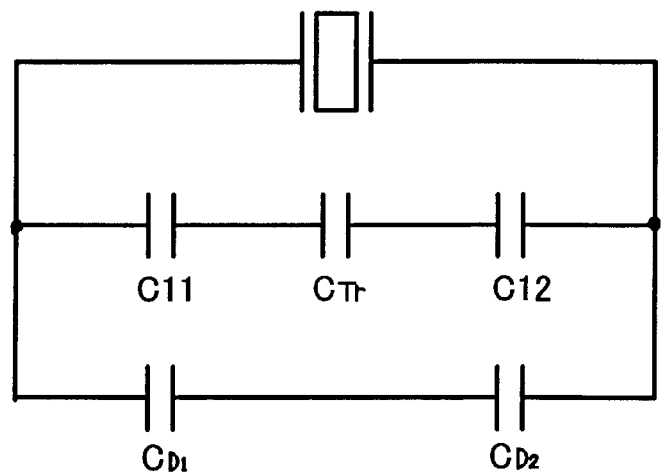
FIG. 4 is an equivalent circuit diagram illustrating extracted capacitance components of the voltage-controlled oscillator shown in FIG. 3.

In such a voltage-controlled oscillator, an equivalent circuit representing only capacitance components viewed from quartz-crystal element 2 extracted from the oscillator is as shown in FIG. 4. Capacitance component $C_{Tr}$ of transistor 1 and capacitors C11, C12 constitute a series circuit with respect to quartz-crystal element 2, and a series circuit comprising capacitances $C_{D1}$, $C_{D2}$ of first and second variable capacitance diodes D1, D2 is connected in parallel with the serial circuit.

Thus, a change in capacitances $C_{D1}$, $C_{D2}$ of variable capacitance diodes D1, D2 caused by control voltage $V_c$ is only added and not reduced by capacitors C11, C12 for DC blocking due to the connection in parallel with capacitors C11, C12. In the circuit configuration, since capacitors C11, C12 can be reduced in size as long as a sufficient feedback amount for oscillation can be ensured, and capacitance component $C_{Tr}$ of transistor 1 is small, it is possible to reduce the influence of capacitors C11, C12 in the equivalent circuit. As a result, a large amount of change in the oscillation frequency can be obtained in the voltage-controlled oscillator. It is not necessary to use capacitors C11, C12 with large capacitance values since they have only to block DC. It is thus possible to achieve a reduction in size of an IC chip incorporating the voltage-controlled oscillator.

While the aforementioned embodiment provides a bias voltage to transistor 1 for oscillation as self-bias with resistor 5, the present invention is not limited thereto. A fixed bias with dividing resistors, not shown, from power supply $V_{cc}$ may be used. The transistor for oscillation and amplification is not limited to a bipolar transistor, and an FET (Field Effect Transistor) may be used instead. When an FET is used, a source, a gate, and a drain of the FET correspond to the emitter, base, and collector of the transistor in the aforementioned description. Since the bipolar transistor generally exhibits more favorable phase noise characteristics than the FET, the bipolar transistor is advantageously used when a voltage-controlled oscillator for a communication device is formed, for example.

Instead of variable capacitance diodes D1, D2 in the aforementioned description, it is possible to use a semiconductor device which shows a substantial capacitance change in response to control voltage $V_c$ applied thereto. Such a semiconductor device is included in the category of the variable capacitance diode in the present invention.

What is claimed is:

1. A voltage-controlled oscillator comprising:
   a transistor for oscillation and amplification;
   first and second nodes;
   a piezoelectric vibrator having two ends directly coupled to said first and second nodes, respectively;
   a first capacitor connecting said first node with a first terminal of said transistor;
   a second capacitor connecting said second node with a second terminal of said transistor;
   a first variable capacitance diode directly coupled to said first node;
   a second variable capacitance diode directly coupled to said second node; and
   means for applying a control voltage to said first and second variable capacitance diodes.

2. The voltage-controlled oscillator according to claim 1, wherein said transistor is a bipolar transistor, said first terminal is a base of said bipolar transistor, said second terminal is a collector of said bipolar transistor, and said bipolar transistor operates with its emitter grounded.

3. The voltage-controlled oscillator according to claim 2, wherein said piezoelectric vibrator is a quartz-crystal element.

4. The voltage-controlled oscillator according to claim 2, further comprising a single bipolar transistor.

5. The voltage-controlled-oscillator according to claim 4, wherein said piezoelectric vibrator is a quartz-crystal element.

6. The voltage-controlled oscillator according to claim 2, wherein said first variable capacitance diode connects said first node with a ground point, and said second variable capacitance diode connects said second node with a ground point.

7. The voltage-controlled oscillator according to claim 6, wherein said applying means comprises an input terminal receiving the control voltage, a first resistor connecting said input terminal with said first node, and a second resistor connecting said input terminal with said second node.

8. The voltage-controlled oscillator according to claim 2, further comprising a collector resistor connecting said collector with a power supply and a bias resistor connecting said collector with said base.

9. The voltage-controlled oscillator according to claim 2, further comprising a single bipolar transistor.

10. The voltage-controlled-oscillator according to claim 9, wherein said piezoelectric vibrator is a quartz-crystal element.

11. A voltage-controlled oscillator comprising:

a transistor configured to oscillate and amplify;

first and second nodes;

a piezoelectric vibrator having two ends directly coupled to said first and second nodes, respectively;

a first capacitor connecting said first node with a first terminal of said transistor;

a second capacitor connecting said second node with a second terminal of said transistor;

a first variable capacitance diode directly coupled to said first node;

a second variable capacitance diode directly coupled to said second node; and an applying mechanism configured to apply a control voltage to said first and second variable capacitance diodes.

12. The voltage-controlled oscillator according to claim 11, wherein said transistor is a bipolar transistor, said first terminal is a base of said bipolar transistor, said second terminal is a collector of said bipolar transistor, and said bipolar transistor operates with its emitter grounded.

13. The voltage-controlled oscillator according to claim 12, wherein said piezoelectric vibrator is a quartz-crystal element.

14. The voltage-controlled oscillator according to claim 12, wherein said first variable capacitance diode connects said first node with a ground point, and said second variable capacitance diode connects said second node with a ground point.

15. The voltage-controlled oscillator according to claim 14, wherein said applying mechanism comprises an input terminal receiving the control voltage, a first resistor connecting said input terminal with said first node, and a second resistor connecting said input terminal with said second node.

16. The voltage-controlled oscillator according to claim 12, further comprising a collector resistor connecting said collector with a power supply and a bias resistor connecting said collector with said base.

* * * * *